US008754680B2

(12) United States Patent
Xiao et al.

(10) Patent No.: US 8,754,680 B2
(45) Date of Patent: *Jun. 17, 2014

(54) POWER-ON-RESET CIRCUITRY

(71) Applicant: Altera Corporation, San Jose, CA (US)

(72) Inventors: Ping Xiao, Cupertino, CA (US);
Weiyding Ding, Saratoga, CA (US); Leo Min Maung, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/924,153

(22) Filed: Jun. 21, 2013

(65) Prior Publication Data
US 2013/0285717 A1 Oct. 31, 2013

Related U.S. Application Data

(62) Division of application No. 12/619,049, filed on Nov. 16, 2009, now Pat. No. 8,487,673, which is a division of application No. 11/784,373, filed on Apr. 6, 2007, now Pat. No. 7,639,052.

(51) Int. Cl.
*H03L 7/00* (2006.01)
(52) U.S. Cl.
USPC ............................................. 327/143; 327/87
(58) Field of Classification Search
USPC ............ 327/72–78, 80–82, 87, 142, 143, 198
See application file for complete search history.

(56) References Cited

U.S. PATENT DOCUMENTS 4,473,759 A * 9/1984 Mahabadi .................. 327/68
5,243,233 A 9/1993 Cliff
5,369,310 A 11/1994 Badyal et al.
5,446,404 A 8/1995 Badyal et al.
5,760,624 A 6/1998 McClintock
5,821,787 A 10/1998 McClintock
6,204,706 B1 3/2001 Horvath
6,936,998 B2 * 8/2005 Cho ........................... 323/280
7,015,732 B1 3/2006 Holloway
7,028,270 B1 4/2006 Lam
7,030,647 B1 4/2006 White
7,085,870 B2 8/2006 Do
7,142,024 B2 11/2006 Youssef (Continued)

FOREIGN PATENT DOCUMENTS

JP 2004 278052 10/2004
WO 2004/023520 A 3/2004

*Primary Examiner* — Long Nguyen
(74) *Attorney, Agent, or Firm* — Treyz Law Group; Jason Tsai

(57) ABSTRACT

Power-on-reset circuitry is provided for integrated circuits such as programmable logic device integrated circuits. The power-on-reset circuitry may use comparator-based trip point voltage detectors to monitor power supply voltages. The trip point detectors may use circuitry to produce trip point voltages from a bandgap reference voltage. Controller logic may process signals from the trip point detectors to produce a corresponding power-on-reset signal. The power-on-reset circuitry may contain a noise filter that suppresses noise from power supply voltage spikes. Normal operation of the power-on-reset circuitry may be blocked during testing. The power-on-reset circuitry may be disabled when the bandgap reference voltage has not reached a desired level. The power-on-reset circuitry may be sensitive or insensitive to the power-up sequence used by the power supply signals. Brownout detection blocking circuitry may be provided to prevent the output from one of the trip point detectors from influencing the power-on-reset circuitry.

20 Claims, 12 Drawing Sheets

(56) References Cited

U.S. PATENT DOCUMENTS

| | | | |
|---|---|---|---|
| 7,639,052 B2 * | 12/2009 | Xiao et al. | 327/143 |
| 7,705,659 B1 | 4/2010 | Liu | |
| 8,487,673 B2 * | 7/2013 | Xiao et al. | 327/143 |
| 2002/0101263 A1 | 8/2002 | Kinoshita et al. | |
| 2006/0053242 A1 | 3/2006 | Do | |

* cited by examiner

POWER-ON-RESET CIRCUITRY

This application is a division of patent application Ser. No. 12/619,049, filed Nov. 16, 2009, which is a division of patent application Ser. No. 11/784,373, filed Apr. 6, 2007, now U.S. Pat. No. 7,639,052, each of which is hereby incorporated by reference herein in its entirety.

BACKGROUND

This invention relates to power-on-reset circuitry, and more particularly, to power-on-reset circuitry with comparator-based trip point detectors for integrated circuits such as programmable logic device integrated circuits.

Integrated circuits are powered using power supply voltages. The power supply voltages may be supplied from an external source or may be derived from an external source using on-chip circuitry. Power-on-reset circuitry is used to control the power-on sequence for an integrated circuit.

Power-on-reset circuitry monitors the voltage associated with a given power supply. When the power supply attains a voltage within its normal operating range, the power-on-reset circuit generates an appropriate power-on-reset (POR) signal at its output. The state of the POR signal is indicative of the state of the power supply. When the power supply is not present or is below its normal operating range, the POR signal has one state, whereas when the power supply signal has risen to a valid level, the POR signal has another state. Use of the power-on-reset circuitry and associated POR signal ensures that sensitive logic circuitry does not commence operation before the power supply voltage is within its proper operating range. This helps to prevent errors that might otherwise arise from using an inadequate power supply.

Programmable logic devices and other integrated circuits are often powered using multiple power supply levels. The main processing circuitry on an integrated circuit, which is sometimes referred to as core circuitry or core logic, is often powered using a relatively low power supply voltage. Input-output circuitry is used to interface with external components and is often powered using a somewhat larger power supply voltage. In some integrated circuits, intermediate power supply voltages are used to power other blocks of circuitry.

Particularly in environments such as these, it can be difficult for power-on-reset circuitry to produce accurate power-on-reset signals. When multiple power supply voltages are involved, each power supply voltage may power up at a different time and may have a different operating voltage. This places a burden on the processing capabilities of the power-on-reset circuitry. Moreover, the relatively low core power supply voltages that are used on many integrated circuits are difficult to monitor accurately. Conventional power supply monitoring circuits are constructed from transistors with known threshold voltages. If the threshold voltages are accurately controlled, a signal can be generated that has one state when a power supply voltage trip point has not been exceeded and that has another state when the power supply voltage rises above the trip point. As core power supply voltages become lower and as transistor sizes shrink with advances in process technology, the ratio of transistor threshold voltage to core power supply voltage on an integrated circuit is becoming increasingly susceptible to process and temperature variations. These variations degrade the accuracy of conventional power-on-reset circuits.

It would therefore be desirable to be able to provide improved power-on-reset circuitry.

SUMMARY

In accordance with the present invention, power-on-reset circuitry may be provided for integrated circuits such as programmable logic device integrated circuits. The power-on-reset circuitry may monitor multiple different power supply voltages. Each power supply voltage may be monitored by a corresponding comparator-based voltage trip point detector.

A voltage reference source such as a bandgap voltage reference may supply a reference voltage to the trip point detectors. The trip point detectors may contain voltage divider circuitry and voltage multiplier circuitry for generating desired voltage trip points from the reference voltage. A comparator in each trip point detector may be used to compare a power supply voltage that has been received by that detector to the voltage trip point for that detector.

Power-on-reset controller logic may process output signals from the trip point detectors to produce a power-on-reset output signal for the power-on-reset circuitry. Feedback circuitry in the power-on-reset controller logic may be used to block brownout detection by one of the trip point detectors.

Normal operation of the power-on-reset circuitry may be blocked by a test enable signal that forces the power-on-reset signal to a low value. This allows an integrated circuit to be tested at low power supply voltages.

When the reference voltage from the voltage reference source has not attained a desired level, the power-on-reset circuitry may be temporarily disabled.

Filter circuitry may be used to suppress noise due to power supply voltage spikes.

The power-on-reset circuitry may contain circuitry that is responsive to the order in which the power supply voltages power up or may be power-up-sequence independent.

Further features of the invention, its nature and various advantages will be more apparent from the accompanying drawings and the following detailed description of the preferred embodiments.

DETAILED DESCRIPTION

The present invention relates to power-on-reset circuitry. The power-on-reset circuitry may be used in integrated circuits such as programmable logic device integrated circuits. If desired, the power-on-reset circuitry may be formed on other integrated circuits, such as digital signal processing circuits, microprocessors, application specific integrated circuits, etc. For clarity, the present invention will generally be described in the context of programmable logic device integrated circuits.

Figure 1:
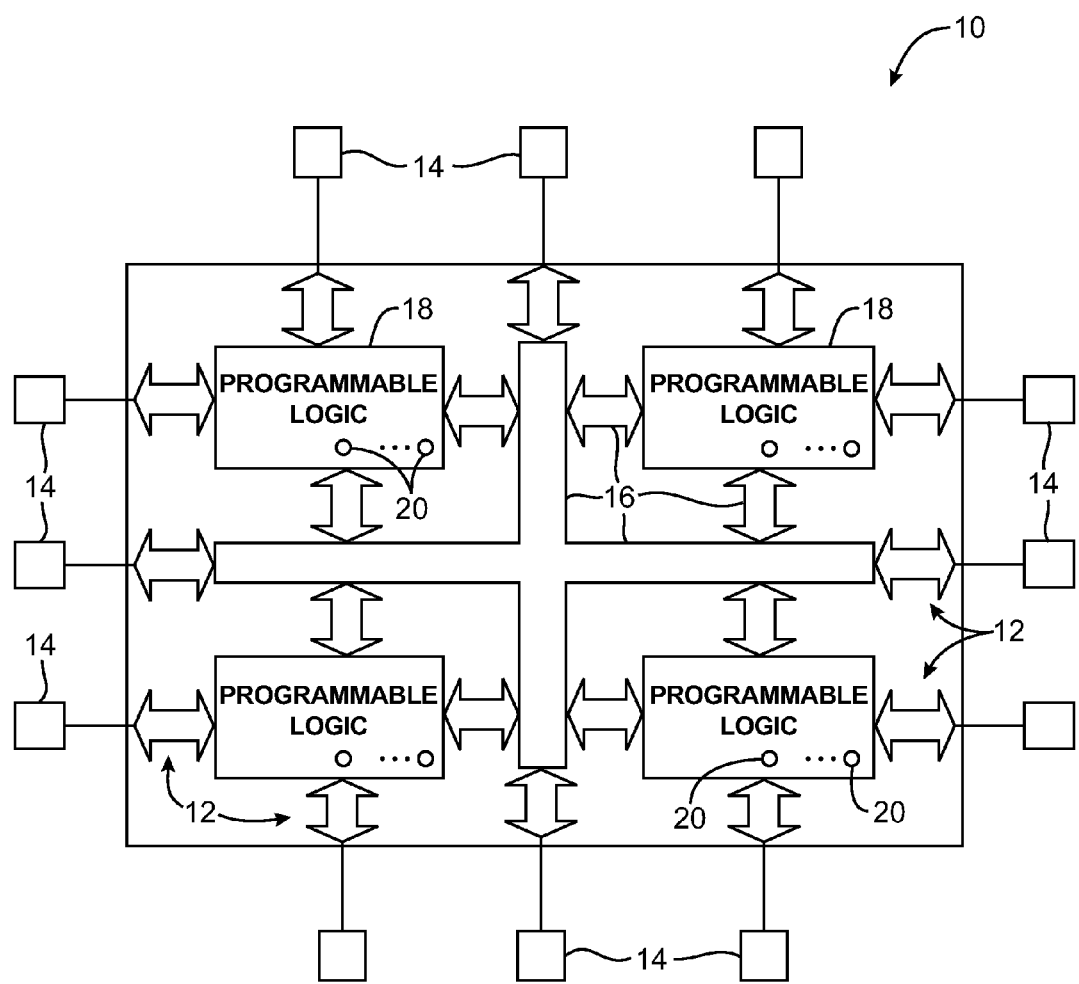
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally re-channel metal-oxide-semiconductor (NMOS) pass transistors in programmable components such as multiplexers, logic gates such as AND gates, NAND gates, etc. When a memory element output that is associated with an NMOS pass transistor is high, the pass transistor controlled by that memory element is turned on and passes logic signals from its input to its output. When the memory element output is low, the pass transistor is turned off and does not pass logic signals. P-channel metal-oxide-semiconductor transistors can also be controlled by memory element output signals.

Memory elements 20 may be formed using complementary metal-oxide-semiconductor (CMOS) integrated circuit technology or using any other suitable fabrication technique. In the context of programmable logic device integrated circuits, the memory elements store configuration data and are therefore sometimes referred to as configuration random-access memory (CRAM) cells.

Configuration random-access memory elements 20 are generally arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control (e.g., turn on and off) portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Different portions of integrated circuits such as programmable logic device integrated circuit 10 may be powered using different power supply voltage levels. For example, core logic (i.e., the central or main logic circuitry) on device 10 may be powered using a relatively low core logic power supply voltage (e.g., a 1.2 volt core logic power supply voltage), whereas input-output circuitry 12 may be powered using a potentially larger voltage (e.g., an input-output power supply voltage of 1.2 volts, 1.8 volts, 2.5 volts, 3.0 volts, or 3.3 volts). Still other circuitry (e.g., voltage regulator circuitry that is used to generate one or more on-chip power supply voltages) may be powered using another power supply voltage (e.g., a 2.5 volt power supply voltage).

In a typical scenario, device 10 is mounted on a circuit board in a system. Power supply voltages such as the core logic power supply voltage, input-output power supply voltage, and voltage regulator power supply voltage are supplied to device 10 through input-output pins 14. To prevent damage to circuitry on device 10 and to prevent data corruption, power-on-reset circuitry monitors the power supply voltages. When the system is powered up, each power supply voltage ramps up towards its normal operating voltage. When the power-on-reset circuitry determines that all of the power supply voltages have attained their intended voltage levels, the power-on-reset circuitry generates a corresponding power-on-reset POR signal at its output.

In an "active high" system, the POR signal is low when the power supplies have all reached their proper voltage and is high whenever one or more of the power supply voltages is not at its proper voltage. The POR signal serves as an internal enable signal. Circuitry on device 10 can monitor the output of the power-on-reset circuitry and can commence normal operation when the POR signal indicates that the power supply signals are all valid. If one or more of the power supply voltages is disrupted during operation (e.g., if one of the power supply voltages exhibits a brownout condition by dropping below its minimum valid voltage level), the power-on-reset circuitry can detect the disruption and change the state of the POR signal at its output accordingly.

Figure 2:
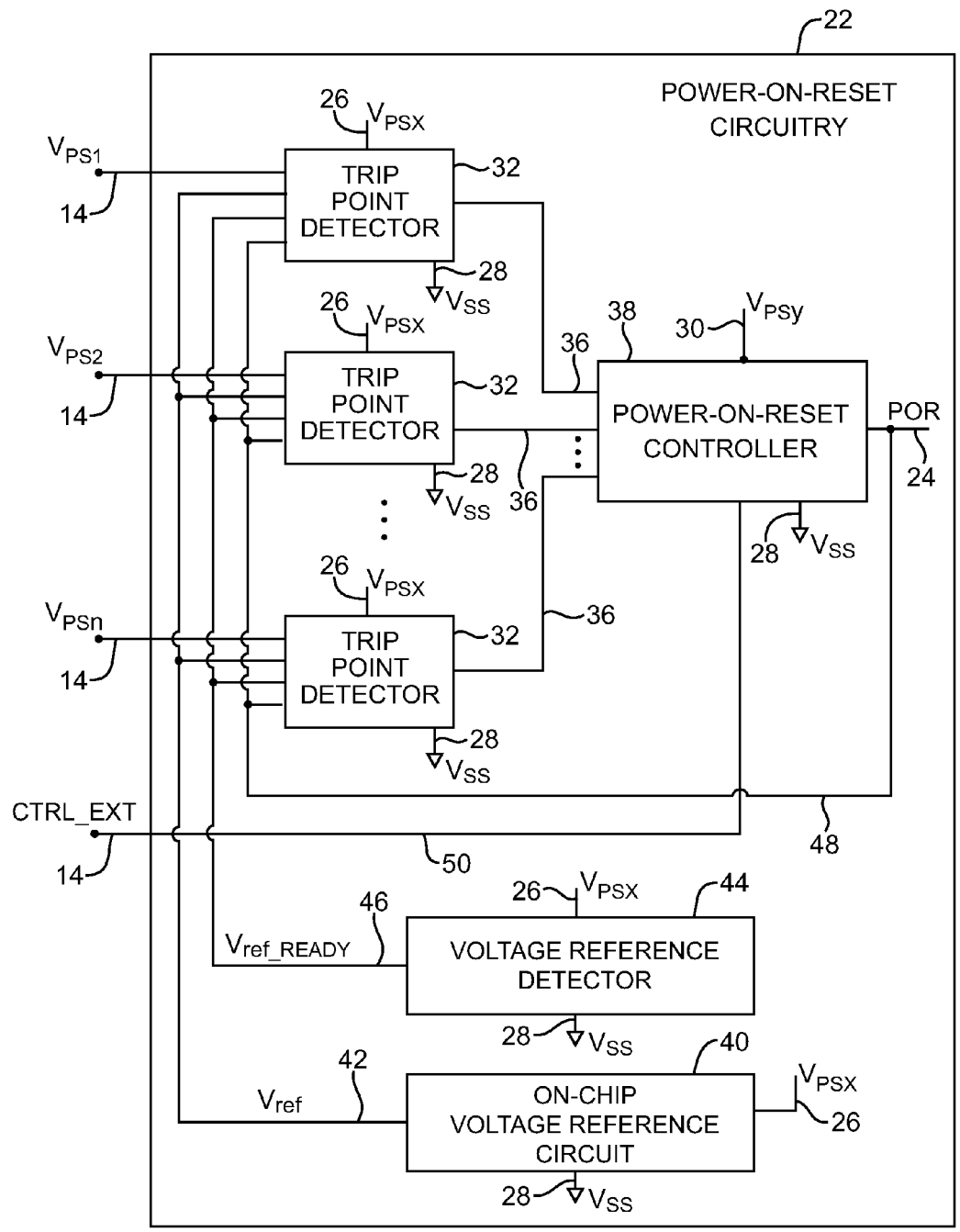
FIG. 2 is a diagram of illustrative power-on-reset circuitry in accordance with an embodiment of the present invention.

Illustrative power-on-reset circuitry 22 of the type that may be used in an integrated circuit such as programmable logic device integrated circuit 10 of FIG. 1 is shown in FIG. 2. As shown in FIG. 2, power-on-reset circuitry 22 may receive power supply signals Vps1, Vps2, . . . Vpsn and control signals such as control signal CTRL_EXT via input-output pins 14. Power-on-reset circuitry 22 can process these signals and produce a corresponding power-on-reset output signal POR at output 24. The signal POR may be provided to circuitry on device 10 such as core logic, input-output circuitry, and voltage regulator circuitry. When the signal POR is low (as an example), the circuitry on device 10 such as the core logic, input-output circuitry and voltage regulator circuitry may be operated normally. When the signal POR is high, normal circuit operations may be reset. If desired, an inverter or other suitable logic may be used to invert the POR signal, thereby converting an active-high POR arrangement into an active-low POR arrangement.

Power-on-reset circuitry 22 may be powered using one or more suitable power supply voltages. In the example of FIG. 2, power-on-reset circuitry 22 is powered by a positive power supply voltage Vpsx at terminals 26, a ground power supply voltage (e.g., 0 volts) at terminals 28, and a positive power supply voltage Vpsy at terminal 30. The power supply voltages Vpsx and Vpsy may be selected from the power supply voltages Vps1, Vps2, . . . Vpsn (as an example). If desired, more power supply voltages may be used to power the components of power-on-reset circuitry 22. The arrangement of FIG. 2 is merely illustrative.

The power supply voltages Vps1, Vps2, . . . Vpsn are used to power respective blocks of circuitry on device 10. Each power supply voltage is also routed to a respective trip point detector 32. Trip point detectors 32 each have an associated voltage trip point. Comparator circuitry or other suitable circuitry in trip point detectors 32 compares power supply voltages Vps1, Vps2, . . . Vpsn to respective trip point voltages (sometimes referred to a trip points or thresholds). The trip point voltage detectors 32 produce corresponding output signals at outputs 36. If, for example a power supply voltage is less than the trip point voltage, indicating that the power supply voltage has not yet reached its desired level, a trip point detector may produce a high output signal at its output 36. If the power supply voltage is greater than the trip point voltage, indicating that the power supply voltage has reached its normal operating range, the trip point voltage detector may produce a low output signal at its output. (These signal polarities are merely illustrative and can be reversed using inverters or other suitable logic gates.)

Power-on-reset controller 38 receives the outputs of the trip point detectors 32 at its inputs and produces a corresponding POR signal at its output 24. Power-on-reset controller 38 may contain any suitable logic gates (e.g., AND gates, NAND gates, NOR gates, inverters, etc.), delay circuitry, etc. With one illustrative arrangement, power-on-reset controller 38 may contain logic circuitry that generates a low POR signal at output 24 whenever the signals on line 36 indicate that voltages Vps1, Vps2, . . . Vpsn have obtained their normal operating levels. Power-on-reset controller 38 may be configured to be insensitive to the sequence in which power supplies Vps1, Vps2, . . . Vpsn on power up (a power-up-sequence independent circuit) or may be configured to be sensitive to the sequence in which power supplies Vps1, Vps2, . . . Vpsn power up (a power-up-sequence dependent circuit). Circuitry in power-on-reset controller 38 may be used to detect brownout conditions (i.e., conditions in which a power supply voltage that has reached its normal operating level drops below its minimum allowable voltage). Brownout detection may be blocked for one or more power supply voltages if desired.

Feedback paths such as path 48 may be used to supply the POR signal on output 24 to trip point detectors 32. This allows power-on-reset circuitry 22 to exhibit trip point hysteresis, so that the trip point for a given power supply may be larger during power-up operations than when detecting brownout conditions during normal operation. This can help to prevent the POR signal from cycling excessively due to power supply voltage fluctuations.

On-chip voltage reference circuit 40 may be used to produce a reference voltage Vref on output line 42. The reference voltage Vref may be distributed to each of the trip point detectors 32. With one suitable arrangement, the on-chip voltage reference circuit is a stable and accurate voltage reference circuit such as a bandgap reference circuit. In general, any suitable voltage reference circuitry may be used for circuit 40.

Trip point detectors 32 may contain voltage divider and voltage multiplier circuitry for scaling the voltage reference Vref to larger or smaller voltage levels. The scaled versions of Vref may serve as the trip point voltages that are compared to power supply voltages Vps1, Vps2, . . . and Vpsn.

Circuitry such as voltage reference detector circuitry 44 may be used to determine whether or not the voltage Vref has reached its normal operating voltage. Circuitry 44 may produce a digital Vref_READY signal. If the voltage Vref has not yet fully powered up and is not yet stable, the voltage reference detector 44 may produce a Vref_READY signal at output line 46 that serves to disable the POR circuitry. The Vref_READY signal may be supplied to one or more of the trip point detectors 32 or may be routed to circuitry such as power-on-reset controller 38.

One or more external control signals may be applied to power-on-reset circuitry 22. In the example of FIG. 2, an external signal CTRL_EXT is being applied to power-on-reset controller 38 via path 50. This is merely illustrative. External control signals may be applied to any suitable components in power-on-reset circuitry 22 if desired. As an example, an external control signal may be applied to power-on-reset controller 38 or other circuitry to disable the POR circuitry when performing low-voltage stress testing with a tester.

Any suitable circuitry may be used in trip point detectors 32 to determine whether the power supply voltages Vps1, Vps2, . . . Vpsn are within valid operating ranges. With one particularly suitable arrangement, trip point detectors 32 contain comparators. The comparator circuitry in trip point detectors 32 allows trip point detectors 32 to compare power supply signals Vps1, Vps2, . . . Vpsn to respective voltage thresholds (trip points). The trip point voltage for each trip point detector 32 may be established using a reference voltage from a reference voltage source or may be established by scaling a reference voltage.

Figure 3:
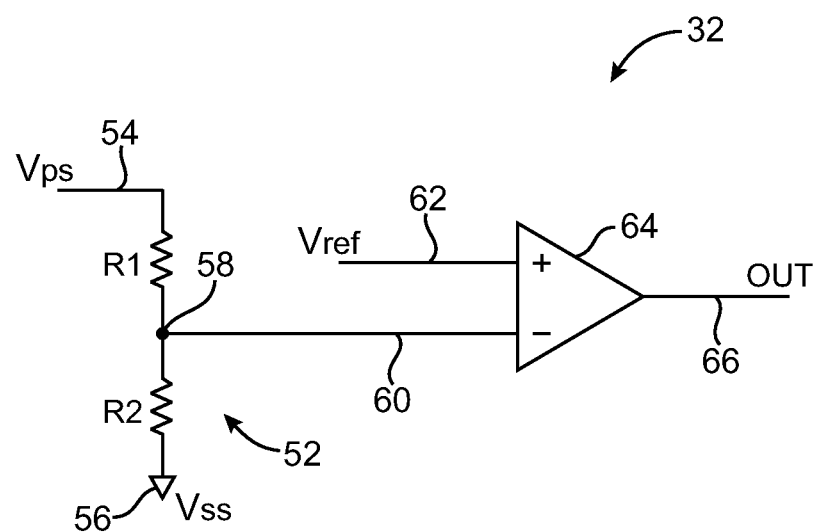
FIG. 3 is a diagram of an illustrative comparator-based power supply voltage trip point detector in accordance with an embodiment of the present invention.

An illustrative trip point detector 32 in which the trip point voltage is scaled up from the reference voltage Vref is shown in FIG. 3. In the example of FIG. 3, the magnitude of the reference voltage Vref may be 1.2 volts and the magnitude of the trip point voltage may be 1.9 volts. A trip point voltage of 1.9 volts may be suitable for monitoring a power supply voltage that is greater than 1.9 volts.

Resistors R1 and R2 are connected in series between input terminal 54 and ground terminal 56. Resistors R1 and R2 form a voltage divider that scales the monitored power supply voltage signal that is presented at terminal 54. The values of resistors R1 and R2 are configured so that the scaled voltage at intermediate voltage divider node 58 is equal to the magnitude of voltage Vref (e.g., 1.2 volts) when the magnitude of Vps is equal to the trip point voltage (e.g., 1.9 volts). The voltage on node 58 is provided to one of the inputs of comparator 64 via path 60. The voltage Vref, which is received from a voltage reference circuit such as circuit 40 of FIG. 2 over a path such as path 42, is routed to the other input of comparator 64 via path 62.

Comparator 64 compares the values of the signals on lines 60 and 62 and produces a corresponding output signal OUT on output 66. During power-up operations, as voltage Vps is rising to its nominal level, the voltage on terminal 54 will be lower than 1.9 volts. As a result, the voltage on node 58 will be less than Vref and the output signal OUT will be high. When the voltage on terminal 54 exceeds the trip point voltage (1.9 volts), the voltage on node 58 will exceed Vref and the output signal OUT of comparator 64 will go low.

In the example of FIG. 3, the trip point voltage was scaled up to a value (1.9 volts) that was greater than the reference voltage Vref (1.2 volts) using voltage divider 52. In some situations, it may be desirable to use a trip point voltage that is less than the reference voltage Vref. In situations such as these, a voltage multiplier arrangement may be used.

Figure 4:
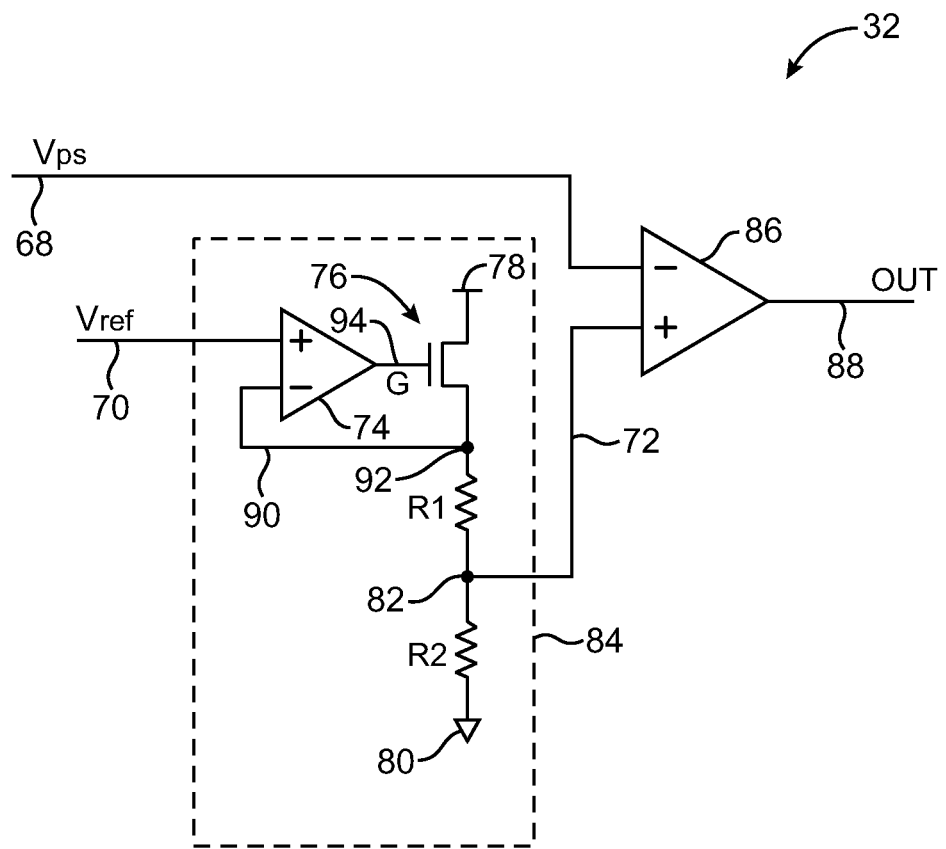
FIG. 4 is a diagram of another illustrative comparator-based power supply voltage trip point detector in accordance with an embodiment of the present invention.

An illustrative trip point detector 32 that has a voltage multiplier circuit 84 is shown in FIG. 4. Trip point detector 32 of FIG. 4 receives a power supply voltage Vps that is to be monitored at input terminal 68. Reference voltage Vref may be provided to terminal 70 from path 42 of FIG. 2. Voltage multiplier circuit 84 scales the reference voltage Vref down to a desired trip point voltage at node 82.

Voltage multiplier circuit 84 has an operational amplifier 74 with a positive input terminal and a negative input terminal. A positive power supply voltage is provided to positive power supply terminal 78 of voltage multiplier circuit 84. Control transistor 76 (e.g., an n-channel metal-oxide-semiconductor transistor) and a voltage divider formed from resistors R1 and R2 are connected in series between positive power supply terminal 78 and ground power supply terminal 80. Feedback path 90 may be used to feed back the voltage on node 92 to the negative input of operational amplifier 74. The reference voltage Vref on terminal 70 is received at the positive input of operational amplifier 74. Operational amplifier 74 produces a control signal on its output that is responsive to the difference between the voltage on node 92 and the reference voltage Vref. The control signal is applied to the gate G of control transistor 76 via line 94.

The values of resistors R1 and R2 are selected so that the trip point voltage at node 82 is less than the voltage Vref at terminal 70. For example, the values of resistors R1 and R2 may be selected so that when Vref is 1.2 volts and the voltage at node 92 is 1.2 volts, the voltage at node 82 is 0.8 volts. The feedback loop in voltage multiplier circuit 84 ensures that the trip point voltage at node 82 is stable.

When the voltage on node 82 rises above the desired trip point, the voltage on node 92 will rise above Vref. The rising voltage on node 92 will be fed back to the negative input terminal of operational amplifier 74 via feedback line 90. In response, operational amplifier 74 will lower the control signal on its output. The lowered output signal will be received at gate G of transistor 76, causing transistor 76 to start to turn off. As transistor 76 starts to turn off, its resistance will rise, thereby lowering the voltage on node 82 back toward the desired trip point.

If the voltage on node 82 falls below the desired trip point voltage, the voltage on node 92 will fall below Vref. Operational amplifier 74 will receive the falling signal from node 92 on its negative input. In response, operational amplifier 74 will increase the value of the control signal at its output. Line 94 will pass the increasing control signal to the gate G of control transistor 76. The increased magnitude of the control signal will tend to turn on transistor 76. As transistor 76 is turned on more fully, its resistance will drop, thereby increasing the trip point voltage on node 82 towards its desired value.

Trip point detector 32 has a comparator 86. One input of comparator 86 receives the power supply signal Vps from line 68. The other input of comparator 86 receives the trip point voltage from node 82 via path 72. Comparator 86 compares the power supply voltage Vps and the trip point voltage and produces a corresponding output signal OUT at output 88. Any suitable polarity arrangement may be used for the output signal OUT. For example, output signal OUT may be high whenever the power supply voltage Vps is below the trip point voltage and low whenever the power supply voltage Vps is above the trip point voltage.

Using trip point detector arrangements of the types shown in FIGS. 3 and 4, power-on-reset circuitry such as power-on-reset circuitry 22 of FIG. 2 may produce a power-on-reset signal POR at its output 24. If desired, the POR signal may be fed back to trip point detectors 32 and used to generate hysteresis. An illustrative trip point voltage detector 32 that receives a fed back POR signal from output 24 and that uses the fed back POR signal to generate hysteresis is shown in FIG. 5.

Figure 5:
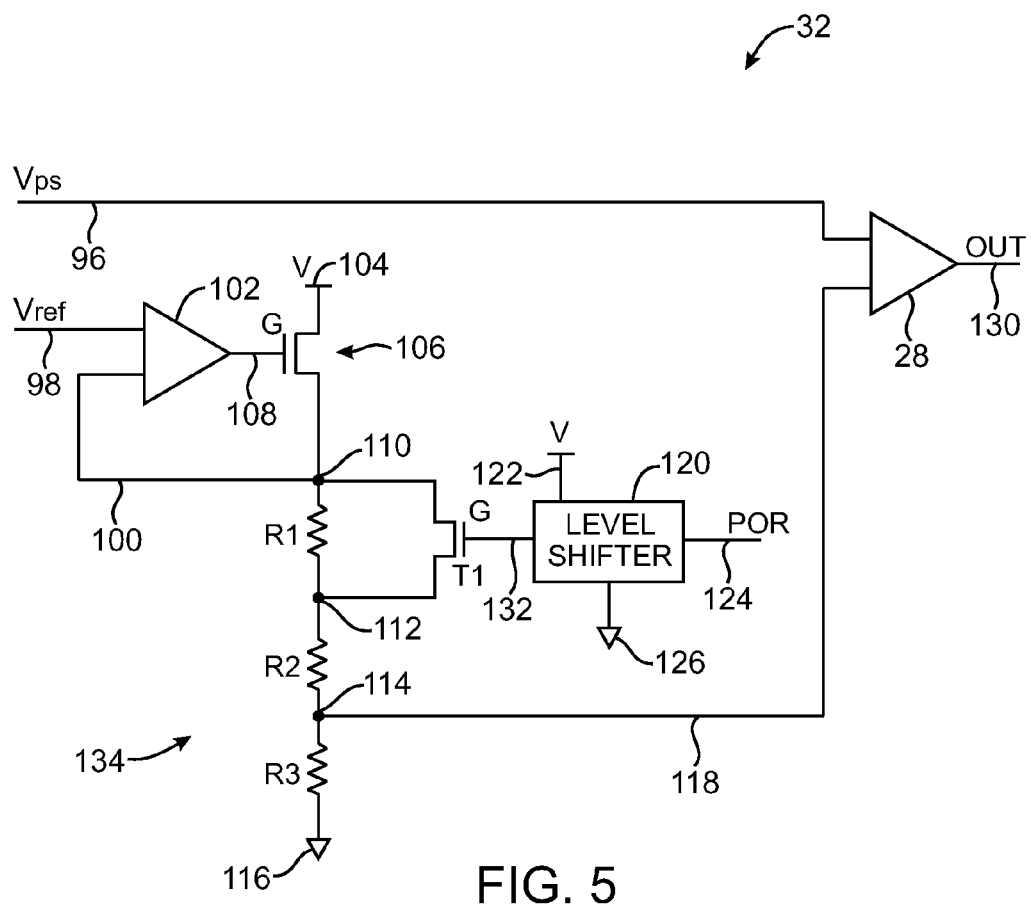
FIG. 5 is a diagram of a comparator-based power supply voltage trip point detector that may be used to provide power-on-reset signal hysteresis in accordance with an embodiment of the present invention.

Trip point detector 32 of FIG. 5 receives a power supply voltage Vps at input 96 and a reference voltage Vref at input 98. The reference voltage Vref may be provided from a voltage reference circuit such as on-chip voltage reference circuit 40 of FIG. 2 (e.g., a bandgap voltage reference). A positive power supply voltage V (e.g., 2.5 volts) is applied to terminal 104. Power supply voltage V may also be used to power operational amplifier 102 and comparator 128. Control transistor 106, resistor R1, resistor R2, and resistor R3 are connected in series between positive power supply terminal 104 and ground terminal 116. The voltage at node 110 is fed back to one of the inputs of operational amplifier 102 via path 100. Operational amplifier 102 compares its inputs and generates a corresponding control signal on its output. The control signal is routed to the gate G of control transistor 106 via line 108.

This circuitry serves to provide a stable trip point voltage at node 114. If the voltage at node 114 rises above the desired trip point voltage, the voltage at node 110 will rise above Vref. Operational amplifier 102 will therefore decrease the value of the control signal on gate G. This will increase the resistance of transistor 106 and will lower the voltage on node 114 towards the desired trip point voltage. If the voltage at node 114 falls below the desired trip point voltage, the voltage on node 110 will fall below Vref. In response, the control signal on gate G will be increased by operational amplifier 102. This will decrease the resistance of transistor 106 and will raise the voltage on node 114 towards the desired trip point voltage.

The POR signal that is fed back from POR output line 24 (FIG. 2) is received at terminal 124 and is level shifted using level shifter 120. The corresponding level-shifted version of the POR signal is supplied to gate G of transistor T1 via path 132. Level shifter 120 may be powered using power supply voltage V (e.g., 2.5 volts) at terminal 122 and ground (0 volts) at terminal 126.

The trip point voltage for trip point detector 32 of FIG. 5 is established on node 114 of voltage divider 134. The trip point voltage is supplied to one of the inputs of comparator 128 via path 118. The other input of comparator 128 receives the monitored power supply voltage Vps from input 96. Comparator 128 compares the trip point voltage on node 114 to the power supply voltage Vps and generates a corresponding output signal OUT on output line 130.

The voltage divider 134 is controlled by the state of the POR signal.

When signal POR is high, the control signal on gate G of transistor T1 is high. This turns on transistor T1. When transistor T1 is turned on, nodes 110 and 112 are shorted together. This forms a bypass path that bypasses resistor R1 and removes resistor R1 from the voltage divider 134. In this situation, voltage divider 134 is formed from the resistors R2 and R3 and the trip point voltage is equal to (Vref*R3)/(R2+R3).

When the signal POR is low, the control signal on the gate G of transistor T1 is low. This turns transistor T1 off. With transistor T1 off, resistor R1 is not bypassed and voltage divider circuit 134 is formed by resistors R1, R2, and R3. In this situation, voltage divider 134 is formed from the resistors R1, R2, and R3, and the trip point voltage is equal to (Vref*R3)/(R1+R2+R3). This value is less than the trip point voltage of (Vref*R3)/(R2+R3) that is obtained when POR is high.

Because the value of the trip point voltage is high when POR is high and is low when POR is low, the trip point detector circuitry of FIG. 5 exhibits hysteresis. Consider, as an example, an illustrative power-on-reset circuit arrangement in which the power-on-reset controller 38 (FIG. 2) generates a low POR signal when Vps reaches its normal operating value. As power supply voltage Vps ramps up from ground, POR is high. With POR high, transistor T1 is on and the voltage trip point is set to its high value. When the high voltage trip point is exceeded, the POR signal will be taken low and the integrated circuit may be operated normally. During normal operation, with POR low, transistor T1 is off and the voltage trip point is set to its low value.

Using a lower voltage trip point during normal operation may be advantageous, because it prevents trip point detector 32 from prematurely changing the state of output signal OUT in reaction to a brownout condition. Even though the power supply voltage Vps may drop slightly, the lowered voltage trip point will prevent the trip point detector from switching its state.

Figure 6:
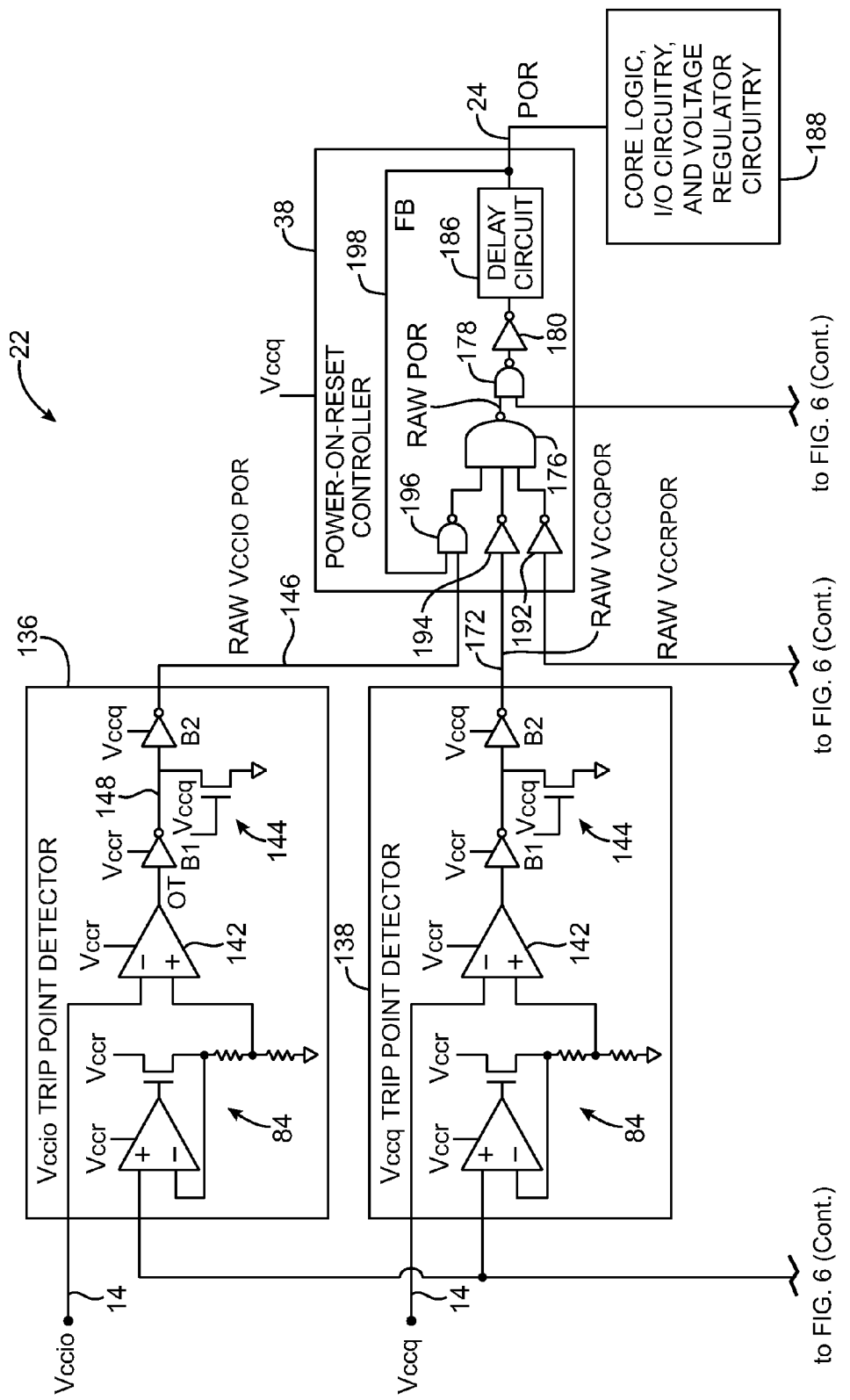
FIG. 6 is a diagram of an illustrative power-on-reset circuit with a number of comparator-based power supply voltage trip point detectors in accordance with an embodiment of the present invention.
Figure 6:
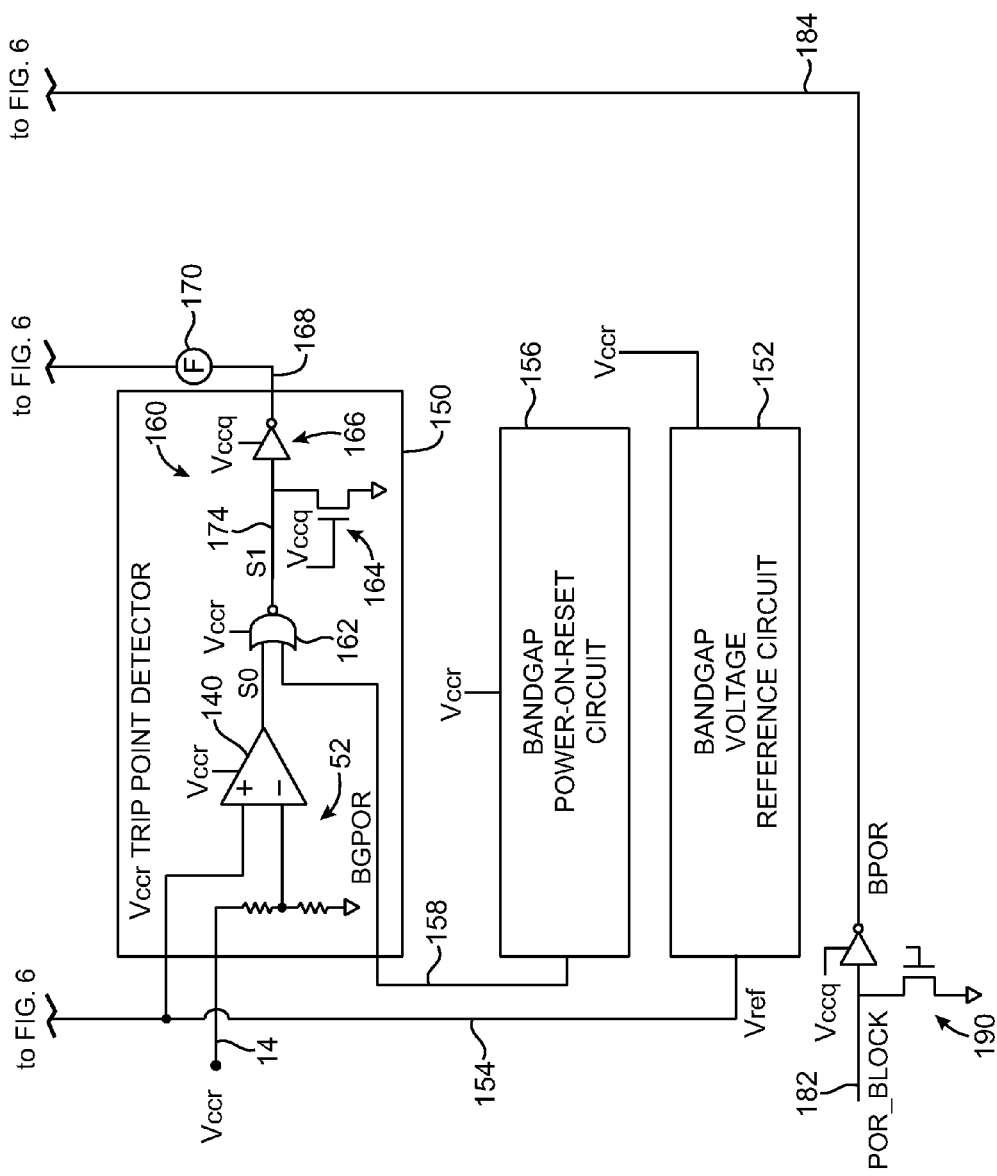

Illustrative power-on-reset circuitry 22 that has three trip point detectors is shown in FIG. 6. In the example of FIG. 6, power-on-reset circuitry 22 receives power supply voltages Vccio, Vccq, and Vccr on input-output pins 14. The power supply voltages that are monitored by circuitry 22 may, in general, have any suitable normal operating voltage levels. With one suitable arrangement, Vccio may have a normal operating voltage level of 1.2 volts, 1.8 volts, 2.5 volts, 3.0 volts, or 3.3 volts (e.g., depending on the type of system in which device 10 is installed). Power supply voltage Vccio may be used to power peripheral circuitry on device 10 such as input-output circuitry 12 (e.g., input buffers, output buffers, etc.). Power supply voltage Vccq may be used to power core logic on device 10 and may have a normal value of 1.2 volts (as an example). Power supply voltage Vccr may be used to power voltage regulator circuitry on device 10 and may have a normal operating value of 2.5 volts (as an example).

Trip point detector 136 is used to monitor the power supply voltage Vccio. Trip point detector 138 is used to monitor the power supply voltage Vccq. Power supply voltage Vccr may be monitored by trip point detector 150.

Trip point detectors 136 and 138 may have voltage multiplier circuits 84 of the type described in connection with FIG. 4. Trip point detector 150 may have a voltage divider circuit 52 of the type described in connection with FIG. 3. The resistors in detector 136 may be selected to set the trip point voltage for detector 136 to 0.9 volts. The resistors in detector 138 may be selected to set the trip point voltage for detector 138 to 0.8 volts. Trip point detector 150 may use resistors that have been selected to establish a trip point voltage of 1.9.

Each trip point detector may receive a reference voltage Vref (e.g., 1.2 volts) from bandgap voltage reference circuit 152. Path 154 may be used to distribute Vref to the trip point detectors. The bandgap voltage reference circuit may produce an accurate and stable reference voltage under a variety of process and temperature conditions.

Bandgap power-on-reset circuit 156 may be used to monitor the power supply voltage that is being used to power bandgap reference circuit 152 (e.g., power supply voltage Vccr) and may produce an output signal BGPOR on line 158 that is indicative of the state of the bandgap voltage reference circuit.

Figure 7:
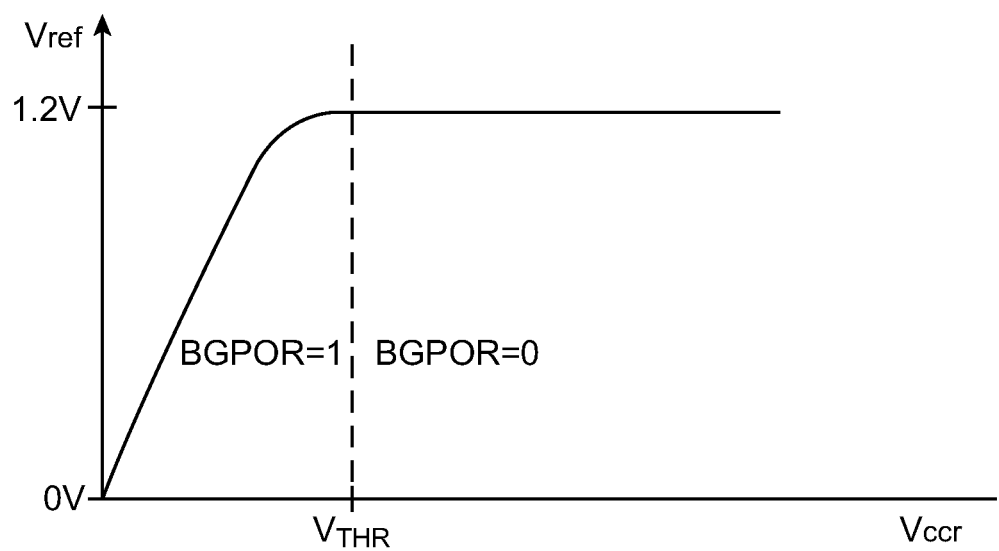
FIG. 7 is a graph showing how power-on-reset circuitry can generate a signal that is indicative of when a reference voltage used by the power-on-reset circuitry is valid in accordance with an embodiment of the present invention.

The output voltage Vref that is produced by bandgap reference circuit as a function of power supply voltage Vccr is shown in the graph of FIG. 7. As shown in FIG. 7, the bandgap voltage reference circuit does not produce a stable known reference voltage Vref until the voltage Vccr exceeds a threshold voltage Vthr. At values of Vccr that are below Vthr, the bandgap power-on-reset circuit 156 produces a high value of BGPOR, indicating that the reference voltage Vref has not yet reached its normal operating level. This high signal may be used as a disable signal that prevents the POR signal at output 24 from going low to permit device 10 to commence normal operation. At values of Vccr that are above Vthr, the bandgap power-on-reset circuit 156 may produce a low value of BGPOR that enables the power-on-reset circuitry 22 for normal operation.

As shown in trip point detector 136, the output of comparator 142 (signal OT) may be inverted by a buffer B1. The output from buffer B1 may be inverted by buffer B2 to produce the trip point detector output signal RAWVCCIOPOR on path 146. Power supply voltage Vccr is normally greater than power supply voltage Vccq, so the output from buffer B1 can drive buffer B2 directly. If Vccr were less than Vccq, a level shifter could be used to boost the signal at the output of buffer B1. Pull-down transistor 144 may be used to ensure that the voltage on path 148 has an appropriate state even if voltage Vccr is floating. If voltage Vccq rises while voltage Vccr is floating, pull down transistor 144 will pull the input to buffer B2 to a known (low) state. This will cause the output of buffer B2 to go high.

The signal RAWVCCIOPOR is indicative of the state of Vccio relative to the voltage trip point of detector 136. When Vccio is below the trip point voltage of detector 136, the value of RAWVCCIOPOR is high. Once Vccio rises above the trip point voltage of detector 136, the value of RAWVCCIOPOR goes low.

Trip point detector 138 may similarly use a comparator 142, inverters B1 and B2, and pull down transistor 144 to produce an output signal RAWVCCQPOR on line 172 that is responsive to the state of power supply voltage Vccq.

During testing, it may be desirable to stress test device 10 using power supply signals that are lower than normal. The brownout detection capabilities of power-on-reset circuitry 22 can interfere with this type of stress testing if not disabled. With one suitable test control arrangement, test enable signal POR_BLOCK is used to block the normal operation of power-on-reset circuitry 22 during testing. A tester or other external equipment may supply the signal POR_BLOCK to pin 182. Signal POR_BLOCK may be taken high when it is desired to turn off power-on-reset monitoring. When signal POR_BLOCK is high, signal BPOR on line 184 is low. The low signal BPOR is provided to one of the inputs of NAND gate 178. With one of the inputs to NAND gate 178 low, the output of NAND gate 178 will always be high. Following inversion by inverter 180 and delay by delay circuit 186, the signal POR at output 24 will be held low. This allows circuitry such as core logic, input-output circuitry, and voltage regulator circuitry 188 to function for testing. In normal operation, no signal is applied to input line 182. Pull down transistor 190 pulls POR_BLOCK low, so that BPOR is taken high. With BPOR high, NAND gate 178 allows signal RAWPOR to pass through delay circuit 186. In this situation, POR circuitry 22 operates normally.

Delay circuit 186 provides additional margin for the POR circuitry 22 by delaying the POR signal on output 24 to accommodate slowly ramping power supply signals on pins 14.

Trip point detector 150 may use comparator 140 to monitor the voltage level associated with power supply signal Vccr and to produce a corresponding output signal RAWVCCR-POR on line 168. Logic circuitry 160 may be used to process the power-on-reset enable/disable signal BGPOR on line 158. Pull down transistor 164 may be used to ensure that the magnitude of signal S1 on path 174 has an appropriate state even if voltage Vccr is floating. If voltage Vccq rises while voltage Vccr is floating, pull down transistor 164 will pull the input to inverter 166 low, causing the output signal RAWVCRPOR on line 168 to go high.

The NOR gate 162 receives signal S0 at one input and signal BGPOR at another input and produces signal S1 at its output. When power supply voltage Vccr is so low that the bandgap voltage reference circuit 152 is not producing a desired value of bandgap reference voltage Vref at its output, BGPOR will be high. When BGPOR is high, the output of NOR gate 162 is always low, which holds signal RAWVCRPOR high. The output of NAND gate 176 will therefore be forced high. Signal BPOR is high in normal operation, so the high output of NAND gate 176 will take the output of NAND gate 178 low. Inverter 180 will invert the low signal at the output of NAND gate 178 to a high signal, so, following the negative edge delay of this signal by delay circuit 186, power-on-reset controller 38 will produce a high POR signal at output 24. In this situation, operation of the entire power-on-reset circuit 22 is blocked by the high BGPOR signal.

Once Vccr rises to a sufficiently high value, circuit 156 will take BGPOR low, as shown in FIG. 7. With BGPOR low at one of the inputs to NOR gate 162, the output signal S1 will be equal to the inverted version of S0. In this situation, the power-on-reset signal POR at output 24 will be responsive to the signals RAWVCCIOPOR, RAWVCCQPOR, and RAWVCCRPOR that are presented to the inputs of power-on-reset controller 38. The power-on-reset circuitry may therefore operate normally.

Power-on-reset controller 38 may receive the raw POR signals from the trip point detectors using inverter 192, inverter 194, and NAND gate 196. Delay circuit 186 may impose a delay on the output signal from inverter 180 to provide additional timing margin. Feedback path 198 may be used to feed back a feedback signal FB from the output of delay circuit 186 to one of the inputs to NAND gate 196. The feedback loop formed by path 198 is used to block brownout detection by trip point detector 136. During normal operation, signal POR at output 24 is low, so brownout detection blocking feedback signal FB is low. If power supply voltage Vccio exhibits a brownout condition by dropping below the voltage set point in trip point detector 136, the signal RAWVCCIOPOR will go high. Because feedback signal FB is low, NAND gate 196 will produce a high signal at its output, just as it would during normal operation. The output of NAND gate 196 is unaffected by the high signal produced by trip point detector 136. The feedback circuitry of power-on-reset controller 38 therefore serves to prevent the Vccio trip point detector from responding to brownouts. The Vccio signal may generally be noisier than other power supply signals due to its use in powering input-output circuitry, so brownout detection blocking may be desirable to prevent unnecessary POR-induced circuit resets.

If desired, the raw power-on-reset signals from the trip point detectors in power-on-reset circuitry 22 may be filtered to remove noise arising from power supply spikes. An illustrative filter 170 that can be used to remove noise in the raw power-on-reset signals that might arise from spikes on the power supply signal Vccr is shown in FIG. 6.

Figure 8:
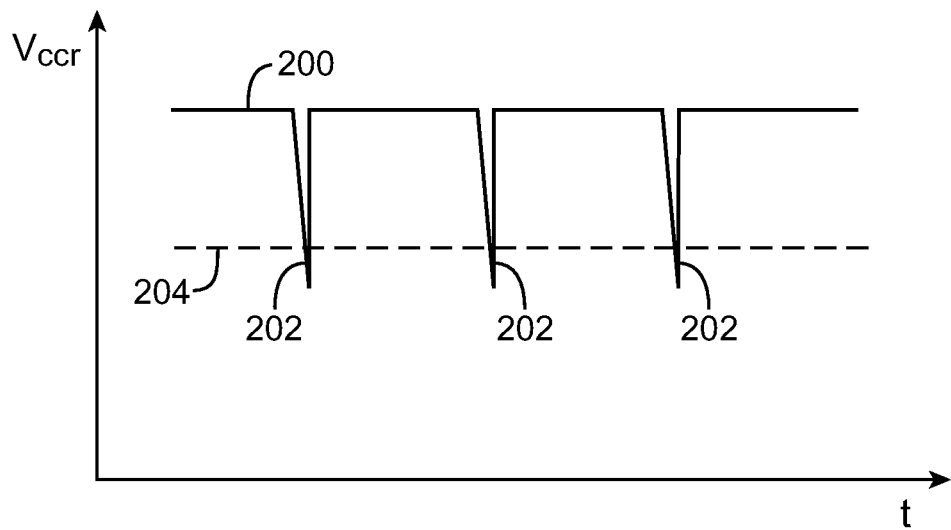
FIG. 8 is a graph showing how a power supply voltage may contain voltage spikes that could change the output state of a power-on-reset circuit.

As shown in FIG. 8, the power supply voltage Vccr may contain voltage spikes 202 that cause the magnitude of the power supply voltage Vccr to drop below the trip point detection threshold represented by dotted line 204. Each time Vccr drops below the trip point 204, the output of detector 150 will produce a high output pulse. Unless suppressed, these high output pulses may cause the POR signal to unnecessarily change its state at output 24.

Figure 9:
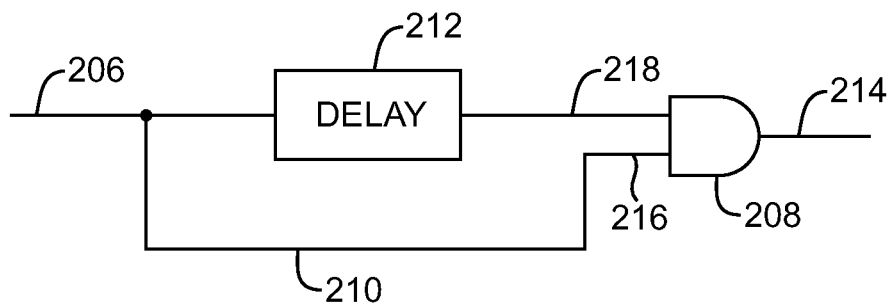
FIG. 9 is a diagram of an illustrative filter circuit that may be used to filter signal noise arising from noisy power supply voltages in power-on-reset circuitry in accordance with an embodiment of the present invention.

Illustrative filter circuitry 170 that may be used to remove undesired noise-induced pulses from path 168 is shown in FIG. 9. Unfiltered output signals from trip point detector 150 are received at input 206. These signals are passed to input 216 of AND gate 208 via path 210. Delay circuit 212 is used to create a delayed version of the signal on input 206. The delayed version of the input signal is provided to input 218 of AND gate 208. By selecting the delay of delay circuit 212 so that it is longer than the width of the noise pulses, noise pulses are suppressed at output 214 of AND gate 208.

Figure 10:
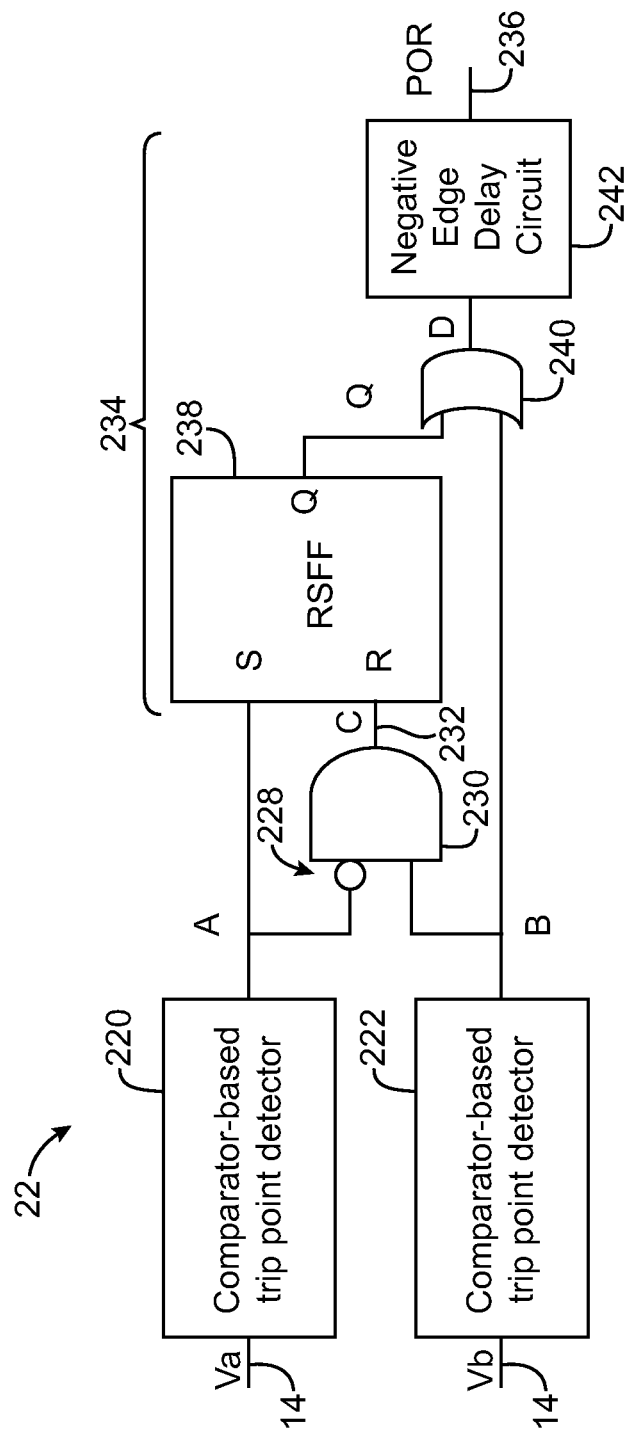
FIG. 10 is a diagram of an illustrative power-on-reset circuit that is responsive to the sequence in which various monitored power supply voltages power up in accordance with an embodiment of the present invention.

The illustrative power-on-reset circuitry 22 of FIG. 6 is insensitive to the order in which power supply signals Vccio, Vccq, and Vccr are powered up in a system. If desired, the power-on-reset circuitry may be sensitive to the power-up sequence for device 10. Illustrative power-up-sequence-dependent power-on-reset circuitry 22 is shown in FIG. 10. Circuitry 22 may have two comparator-based trip point detectors of the type described in FIGS. 3 and 4. Comparator-based trip point detector 220 may monitor power supply voltage Va and may produce a corresponding output signal A on path 224. Comparator-based trip point detector 222 may monitor power supply voltage Vb and may produce a corresponding output signal B on path 226. In this example, the outputs of comparators 220 and 222 go low when the power supply voltages exceed their associated trip point voltages. Circuit 22 has a NAND gate 230 with an inverting input 228 that is used to receive signals A and B. A signal C is produced on path 232 at the output of NAND gate 230. The signal C may be received by delay circuit 234 to produce signal POR on output 236. Delay circuit 234 may be formed using an RS flip-flop 238, an OR gate 240, and a negative-edge triggered delay circuit 242.

Figure 11:
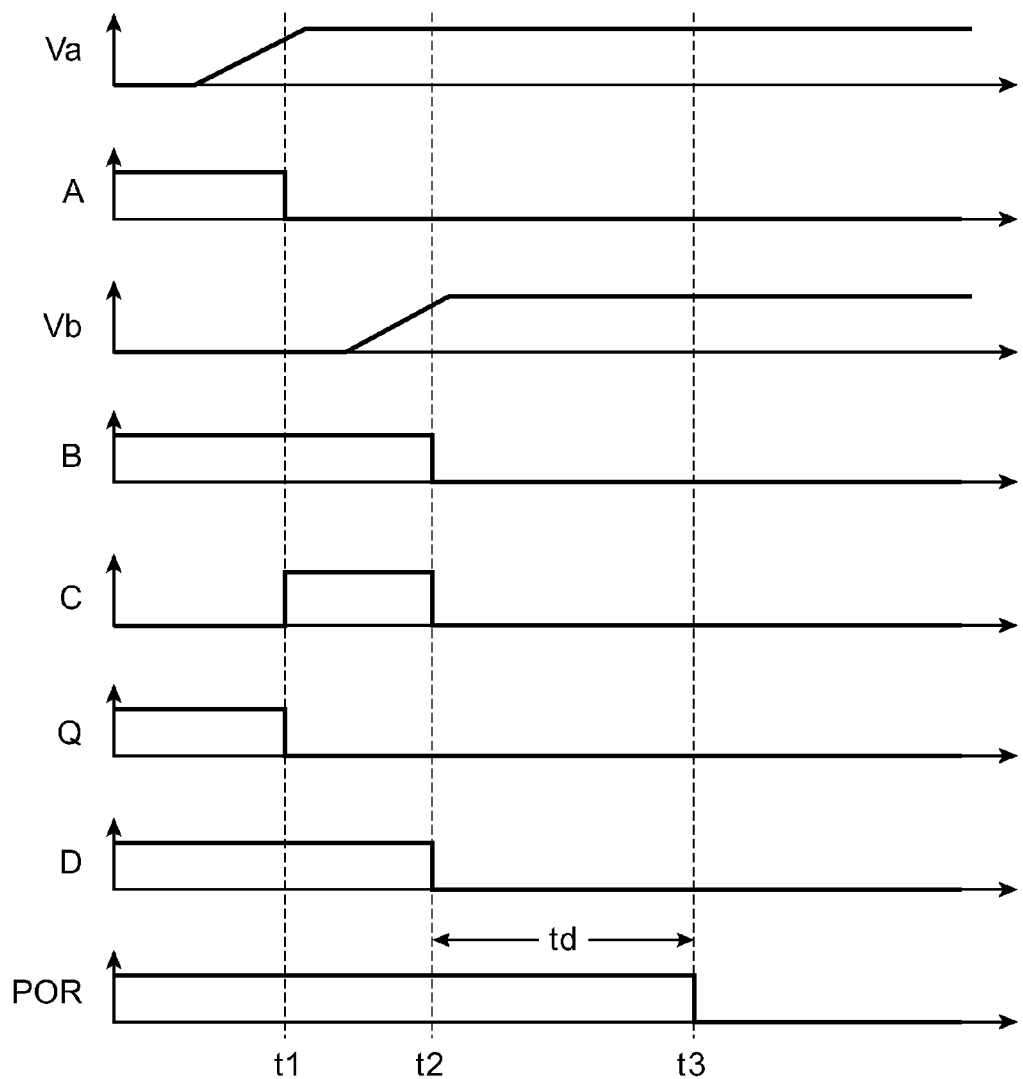
FIGS. 11 and 12 are graphs showing illustrative power up sequences and corresponding power-on-reset output signals that may be generated by a power-on-reset circuit of the type shown in FIG. 10 in accordance with an embodiment of the present invention.
Figure 12:
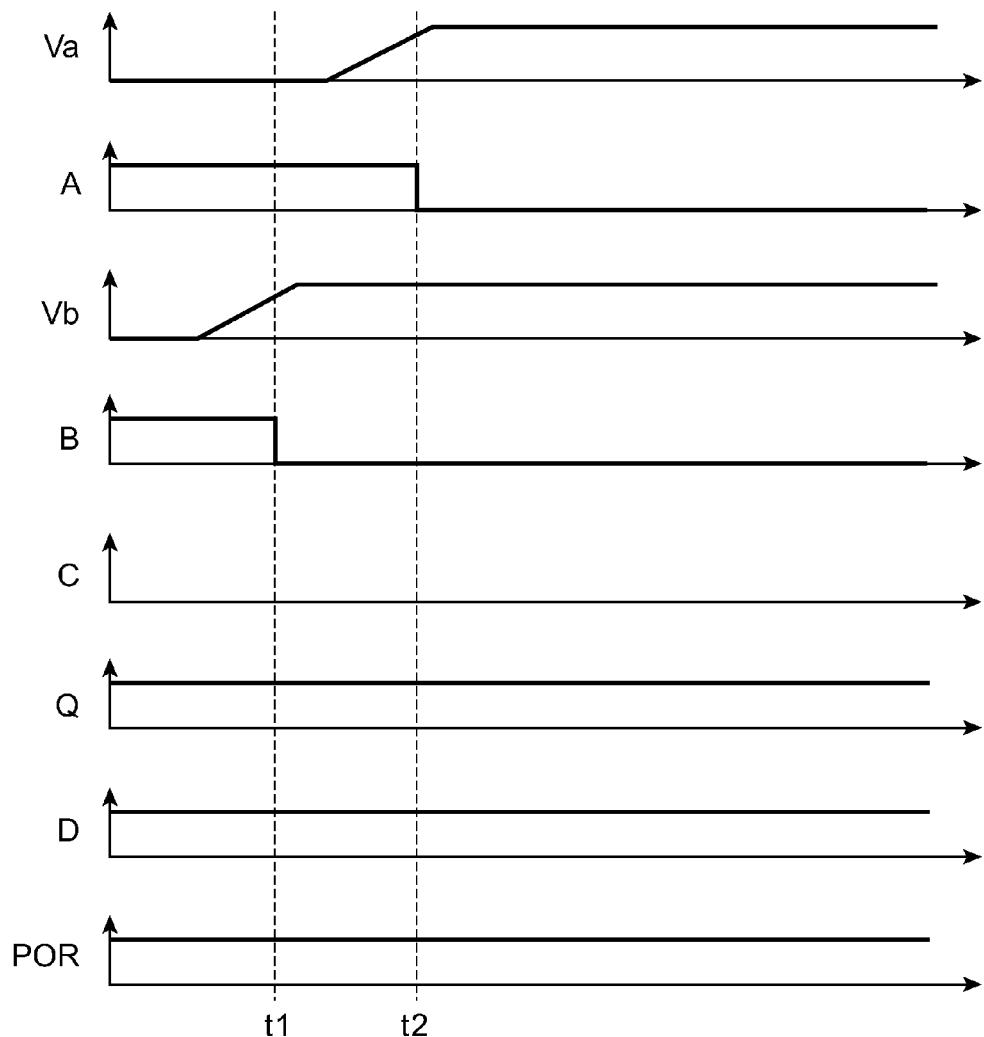

The operation of circuitry 22 of FIG. 10 is illustrated in FIGS. 11 and 12.

In the example of FIG. 11, the power supply signal Va ramps up before power supply signal Vb. As a result, signal A goes low (at time t1) before signal B goes low (at time t2) and the output C takes the form of a pulse of duration t2−t1. Output Q of flip flop 238 goes high when A goes high. At time t1, A goes low and the R input of flip flop 238 goes high, resetting flip flop 238 so that Q goes low. Signal D is equal to the logical OR function of signals B and Q. When B goes low at time t2, signal D is taken low. Negative edge delay circuit 242 produces an output signal POR that is delayed by a time td with respect to the falling edge of signal D. At times t after t3, when the POR signal is low, the circuitry on device 10 can be allowed to operate normally.

In the example of FIG. 12, the power supply signal Va ramps up after power supply signal Vb. In this scenario, the output C of NAND gate 230 remains low and the output POR of delay circuit 234 remains high. This scenario represents an invalid power-up sequence, so the POR signal is maintained at a high level to prevent the circuitry on device 10 from entering normal operation.

The foregoing is merely illustrative of the principles of this invention and various modifications can be made by those skilled in the art without departing from the scope and spirit of the invention.

What is claimed is:

1. Power-on-reset circuitry that monitors multiple power supply voltages and that produces a corresponding power-on-reset signal, comprising:
a plurality of comparator-based trip point detectors each of which includes a comparator, wherein the trip point detectors each compare one of the power supply voltages to a respective trip point voltage; and
power-on-reset controller circuitry that receives an output signal from each of the trip point detectors and that produces the power-on-reset signal in response to receiving the output signal from each of the trip point detectors, wherein when the power supply voltages are powered up in a first sequence the power-on-reset signal is deasserted, and wherein when the power supply voltages are powered up in a second sequence that is different than the first sequence the power-on-reset signal remains asserted.

2. The power-on-reset circuitry defined in claim 1 wherein at least one of the comparator-based trip point detectors comprises a voltage divider circuit that scales a reference voltage to generate the trip point voltage for that trip point detector.

3. The power-on-reset circuitry defined in claim 1 further comprising a bandgap reference circuit that produces a reference voltage that is supplied to each of the trip point detectors, wherein each of the trip point detectors produces its respective trip point voltage from the reference voltage.

4. The power-on-reset circuitry defined in claim 1 further comprising a filter circuit that prevents the power-on-reset circuitry from being influenced by signal spikes in at least one of the power supply voltages.

5. The power-on-reset circuitry defined in claim 1 wherein the power-on-reset circuitry is on a programmable logic device integrated circuit, the programmable logic device integrated circuit further comprising:
programmable memory elements; and
programmable logic that is programmed by configuration data loaded into the memory elements.

6. The power-on-reset circuitry defined in claim 1 wherein the power-on-reset controller circuitry comprises:
a feedback path that carries the power-on-reset signal; and
logic circuitry that receives an output signal from a given one of the trip point detectors and the power-on-reset signal from the feedback path and that prevents the output signal from the given one of the trip point detectors from influencing the power-on-reset signal once the power-on-reset signal has attained a given value.

7. The power-on-reset circuitry defined in claim 1 further comprising a path that provides a reference voltage to each of the trip point detectors, wherein the trip point detectors generate the respective trip point voltages from the reference voltage, and wherein the trip point detectors comprise an input-output voltage trip point detector that monitors an input-output power supply voltage and a core logic voltage trip point detector that monitors a core logic power supply voltage.

8. Power-on-reset circuitry that monitors multiple power supply voltages and that produces a corresponding power-on-reset signal, comprising:
a plurality of comparator-based trip point detectors each of which includes a comparator, wherein the trip point detectors each compare one of the power supply voltages to a respective trip point voltage;
power-on-reset controller circuitry that receives an output signal from each of the trip point detectors and that produces the power-on-reset signal in response to receiving the output signal from each of the trip point detectors; and
a path that provides a reference voltage to each of the trip point detectors, wherein the trip point detectors generate the respective trip point voltages from the reference voltage, and wherein the trip point detectors comprise an input-output voltage trip point detector that monitors an input-output power supply voltage, a core logic voltage trip point detector that monitors a core logic power supply voltage and a voltage regulator power supply trip point detector that monitors a voltage regulator power supply voltage.

9. The power-on-reset circuitry defined in claim 8 wherein the power-on-reset controller circuitry comprises a delay circuit having an input and an output, wherein the power-on-reset signal is provided at the output of the delay circuit.

10. The power-on-reset circuitry defined in claim 8 further comprising a filter circuit that prevents the power-on-reset circuitry from being influenced by signal spikes in at least one of the power supply voltages.

11. The power-on-reset circuitry defined in claim 8 wherein the power-on-reset controller circuitry comprises:
a feedback path that carries the power-on-reset signal; and
logic circuitry that receives an output signal from a given one of the trip point detectors and the power-on-reset signal from the feedback path and that prevents the output signal from the given one of the trip point detectors from influencing the power-on-reset signal once the power-on-reset signal has attained a given value.

12. The power-on-reset circuitry defined in claim 8, wherein the power-on-reset circuitry is on a programmable logic device integrated circuit, the programmable logic device integrated circuit further comprising:
programmable memory elements; and
programmable logic that is programmed by configuration data loaded into the memory elements.

13. The power-on-reset circuitry defined in claim 8 further comprising a bandgap reference circuit that produces the reference voltage that is supplied to each of the trip point detectors.

14. The power-on-reset circuit defined in claim 8, wherein at least a given one of the trip point detectors receives the power-on-reset signal on a feedback path.

15. The power-on-reset circuit defined in claim 14, wherein the respective trip point voltage of the given one of the trip point detectors is configured by the power-on-reset signal.

16. Power-on-reset circuitry that monitors multiple power supply voltages and that produces a corresponding power-on-reset signal, comprising:
a plurality of comparator-based trip point detectors each of which includes a comparator, wherein the trip point detectors each compare one of the power supply voltages to a respective trip point voltage;
power-on-reset controller circuitry that receives an output signal from each of the trip point detectors and that produces the power-on-reset signal in response to receiving the output signal from each of the trip point detectors; and
a filter circuit that is interposed between the power-on-reset controller circuitry and a selected one of the trip point detectors associated with at least one of the power supply voltages and that prevents the power-on-reset circuitry from being influenced by signal spikes in the at least one of the power supply voltages.

17. The power-on-reset circuitry defined in claim 16 wherein at least one of the comparator-based trip point detectors comprises a voltage divider circuit.

18. The power-on-reset circuitry defined in claim 16 wherein the power-on-reset controller circuitry comprises:
   a feedback path that carries the power-on-reset signal; and
   logic circuitry that receives an output signal from a given one of the trip point detectors and the power-on-reset signal from the feedback path and that prevents the output signal from the given one of the trip point detectors from influencing the power-on-reset signal once the power-on-reset signal has attained a given value.

19. The power-on-reset circuit defined in claim 16, wherein at least a given one of the trip point detectors receives the power-on-reset signal on a feedback path.

20. The power-on-reset circuitry defined in claim 16, wherein the power-on-reset circuitry is on a programmable logic device integrated circuit, the programmable logic device integrated circuit further comprising:
   programmable memory elements; and
   programmable logic that is programmed by configuration data loaded into the memory elements.

* * * * *